(12) United States Patent
Lee

(10) Patent No.: US 12,262,530 B2
(45) Date of Patent: Mar. 25, 2025

(54) SEMICONDUCTOR STRUCTURE AND FORMING METHOD THEREOF

(71) Applicant: CHANGXIN MEMORY TECHNOLOGIES, INC., Hefei (CN)

(72) Inventor: Shih-Hung Lee, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 593 days.

(21) Appl. No.: 17/453,361

(22) Filed: Nov. 3, 2021

(65) Prior Publication Data

US 2022/0271039 A1    Aug. 25, 2022

Related U.S. Application Data

(63) Continuation of application No. PCT/CN2021/107436, filed on Jul. 20, 2021.

(30) Foreign Application Priority Data

Feb. 25, 2021   (CN) .......................... 202110215088.9

(51) Int. Cl.
    *H10B 12/00*     (2023.01)
(52) U.S. Cl.
    CPC ........... *H10B 12/482* (2023.02); *H10B 12/03* (2023.02); *H10B 12/30* (2023.02)
(58) Field of Classification Search
    CPC .... H10B 12/03; H10B 12/0335; H10B 12/30; H10B 12/315; H10B 12/482
    See application file for complete search history.

(56) References Cited

U.S. PATENT DOCUMENTS 8,642,466 B2   2/2014   Kim
8,697,525 B2   4/2014   Kim et al.
(Continued)

FOREIGN PATENT DOCUMENTS

CN   103456694 A   12/2013
CN   103915376 A   7/2014
(Continued)

OTHER PUBLICATIONS

International Search Report cited in PCT/CN2021/107436, mailed Nov. 24, 2021, 10 pages.
(Continued)

*Primary Examiner* — Michelle Mandala
*Assistant Examiner* — Kevin Quinto
(74) *Attorney, Agent, or Firm* — Kilpatrick Townsend & Stockton LLP

(57) ABSTRACT

The present disclosure provides a semiconductor structure and a forming method thereof, including: providing a substrate and a plurality of discrete bit line structures, the bit line structures being located on the substrate, capacitor contact windows being provided between adjacent bit line structures; forming first isolation layers, the first isolation layers covering sidewalls of the bit line structures; forming a sacrificial layer, the sacrificial layer covering sidewalls of the first isolation layers; forming second isolation layers, the second isolation layers covering sidewalls of the sacrificial layer and exposing the top surfaces and bottoms of the sacrificial layer; etching the exposed bottoms of the sacrificial layer to form bottom gaps between the first isolation layers and the second isolation layers; etching the exposed top surfaces of the sacrificial layer to remove the remaining of the sacrificial layer so as to form gaps between the layers.

13 Claims, 9 Drawing Sheets

(56) References Cited

U.S. PATENT DOCUMENTS

| | | | |
|---|---|---|---|
| 8,828,829 B2 | 9/2014 | Joung et al. | |
| 8,962,472 B2 | 2/2015 | Rho et al. | |
| 2012/0049190 A1* | 3/2012 | Miyairi | H01L 29/78672 257/E29.294 |
| 2013/0320549 A1 | 12/2013 | Lee et al. | |
| 2016/0181143 A1* | 6/2016 | Kwon | H10B 12/315 438/586 |
| 2016/0247711 A1 | 8/2016 | Kim | |
| 2018/0012775 A1 | 1/2018 | Byun et al. | |

FOREIGN PATENT DOCUMENTS

| | | |
|---|---|---|
| CN | 102543944 B | 6/2016 |
| CN | 106941097 A | 7/2017 |
| CN | 103456694 B | 9/2017 |
| CN | 107895721 A | 4/2018 |
| CN | 111900166 A | 11/2020 |
| CN | 113035869 A | 6/2021 |
| KR | 20090022381 A | 3/2009 |
| KR | 20140083744 A | 7/2014 |

OTHER PUBLICATIONS

First Office Action cited in CN 202110215088.9, mailed Mar. 11, 2022, 19 pages.

* cited by examiner

SEMICONDUCTOR STRUCTURE AND FORMING METHOD THEREOF

CROSS-REFERENCE TO RELATED APPLICATIONS

The present disclosure is a continuation application of International Patent Application No. PCT/CN2021/107436, filed on Jul. 20, 2021 and titled "SEMICONDUCTOR STRUCTURE AND FORMING METHOD THEREOF", which is based on and claims the priority to Chinese Patent Application 202110215088.9, titled "SEMICONDUCTOR STRUCTURE AND FORMING METHOD THEREOF" and filed on Feb. 25, 2021. The entire contents of International Patent Application No. PCT/CN2021/107436 and Chinese Patent Application 202110215088.9 are incorporated herein by reference.

TECHNICAL FIELD

The present disclosure relates to, but not limited to, a semiconductor structure and a forming method thereof.

BACKGROUND

In semiconductor devices such as dynamic random access memories (DRAMs), capacitors and bit line execute electrical operations through source/drain contacts. Since the semiconductor devices are downsized, the distance between capacitor contact holes and bit lines is small, and it is likely to cause signal crosstalk between the bit lines and the capacitor contact holes.

In order to avoid the contact between bit lines and capacitor contact holes, it is necessary to arrange spacers between the bit lines and the capacitor contact holes so as to realize electrical isolation. However, since the spaces also need to play a supporting role, the material for the spacers generally has a relatively high dielectric constant, so that it is disadvantageous to suppress signal crosstalk.

SUMMARY

A first aspect of the present disclosure provides a method for forming a semiconductor structure comprises: providing a substrate and a plurality of discrete bit line structures, the bit line structures being located on the substrate, capacitor contact windows being provided between adjacent bit line structures; forming first isolation layers, the first isolation layers covering sidewalls of the bit line structures; forming a sacrificial layer, the sacrificial layer covering sidewalls of the first isolation layers; forming second isolation layers, the second isolation layers covering the sidewalls of the sacrificial layer and exposing the top surfaces and bottoms of the sacrificial layer; etching the exposed bottoms of the sacrificial layer to form bottom gaps between the first isolation layers and the second isolation layers; etching the exposed top surfaces of the sacrificial layer to remove the remaining of the sacrificial layer so as to form gaps between the layers, the gaps between the layers comprising the bottom gaps.

A second aspect of the present disclosure provides a semiconductor structure, comprising: a substrate and a plurality of discrete bit line structures, the bit line structures being located on the substrate; capacitor contact holes, located between adjacent bit line structures; first isolation layers, the first isolation layers covering sidewalls of the bit line structures; second isolation layers, the second isolation layers covering sidewalls of the capacitor contact holes, the second isolation layers being not in contact with the substrate; and, gaps between the layers, located between the first isolation layers and the second isolation layers.

BRIEF DESCRIPTION OF THE DRAWINGS

The drawings incorporated into the specification and constituting a part of the specification show the embodiments of the present disclosure, and are used with the description to explain the principles of the embodiments of the present disclosure. Throughout the drawings, like reference numerals denote like elements. The drawings to be described hereinafter are some but not all of the embodiments of the present disclosure. Those skilled in the art can obtain other drawings according to these drawings without paying any creative effort.

DETAILED DESCRIPTION

The technical solutions in the embodiments of the present disclosure will be described clearly and completely with reference to the drawings in the embodiments of the present disclosure. Apparently, the embodiments to be described are only some but not all of the embodiments of the present disclosure. All other embodiments obtained on the basis of the embodiments in the present disclosure by those skilled in the art without paying any creative effort shall fall into the protection scope of the present disclosure. It is to be noted that the embodiments of the present disclosure and the features in the embodiments can be arbitrarily combined with each other if not conflicted.

Figure 1:
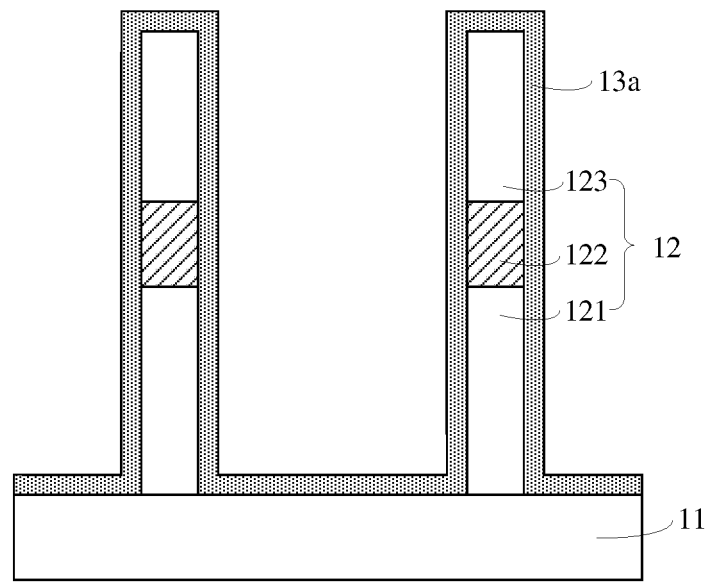
FIG. 1 is a schematic structure diagram of a substrate and bit line structures according to an embodiment of the present disclosure.

Referring to FIG. 1, a substrate 11 and a plurality of discrete bit line structures 12 are provided. The bit line structures 12 are located on the substrate 11, and capacitor contact windows (not shown) are provided between adjacent bit line structures 12. A first isolation film 13a is formed. The first isolation film 13a covers the top surfaces and sidewalls of the bit line structures 12 and the surface of the substrate 11.

Each of the bit line structures 12 comprises a bottom dielectric layer 121, an intermediate conductive layer 122 and a top dielectric layer 123 which are stacked successively. The capacitor contact windows are located between adjacent bit line structures 12. Exactly, the capacitor contact windows are located between spacers between adjacent bit line structures 12. The capacitor contact windows and the spacers occupy part of the space between adjacent bit line structures 12, respectively. The material for the first isolation film 13a is generally silicon nitride. Since silicon nitride has a high hardness, it can support the bit line structures 12. Correspondingly, silicon nitride has a high dielectric constant, so it is disadvantageous to suppress the signal crosstalk between the bit line structures 12 and the subsequently formed capacitor contact holes.

Figure 2:
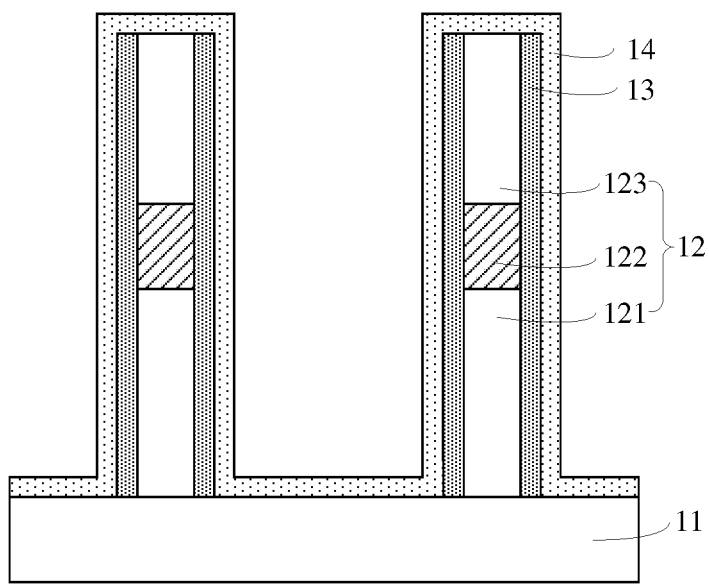
FIG. 2 is a schematic structure diagram of the structure shown in FIG. 1 after first isolation layers and sacrificial layer are formed.

Referring to FIG. 2, the first isolation film 13a (referring to FIG. 1) located on the top surfaces of the bit line structures 12 and covering the surface of the substrate 11 is removed, and the first isolation film 13a located on the sidewalls of the bit line structures 12 is reserved as first isolation layers 13. Sacrificial layer 14 is formed to cover the top surfaces of the bit line structures 12, the sidewalls and top surfaces of the first isolation layers 13 and the surface of the substrate 11.

Figure 3:
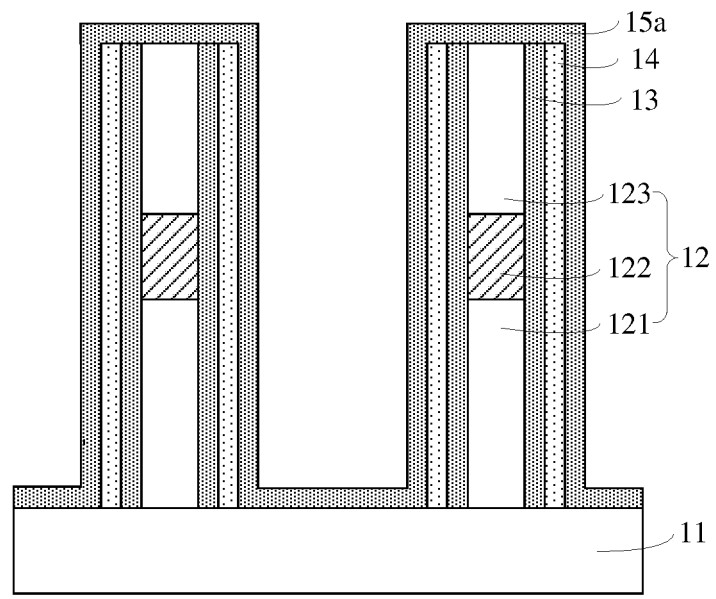
FIG. 3 is a schematic structure diagram of the structure shown in FIG. 2 after a second isolation film are formed.

Referring to FIG. 3, the sacrificial layer 14 covering the top surfaces of the first isolation layers 13 and the bit line structures 12 is removed, the sacrificial layer 14 covering the surface of the substrate 11 is removed, and the sacrificial layer 14 covering the sidewalls of the first isolation layers 13 are reserved. A second isolation film 15a is formed to cover the top surfaces of the bit line structures 12, the top surfaces of the first isolation layers 13, the top surfaces and sidewalls of the sacrificial layer 14 and the surface of the substrate 11. The material for the second isolation film 15a is generally silicon nitride.

Figure 4:
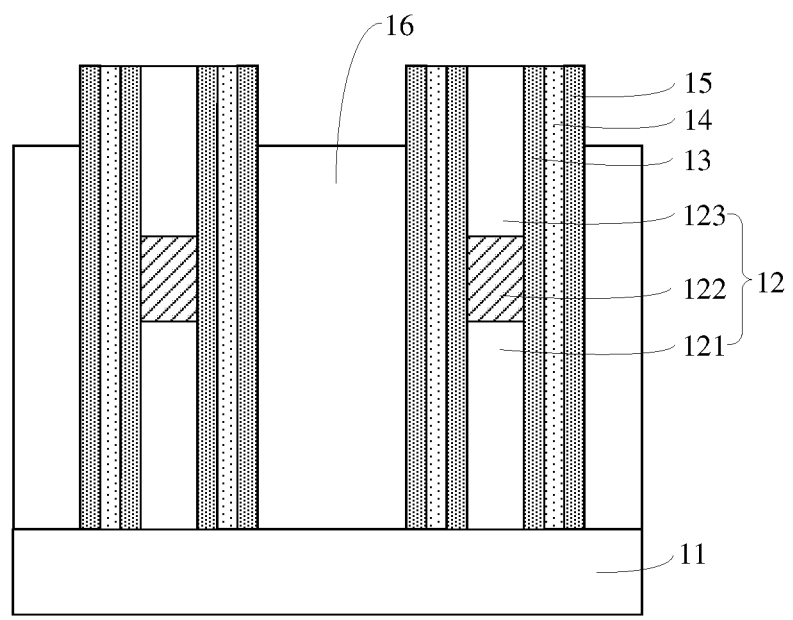
FIG. 4 is a schematic structure diagram of the structure shown in FIG. 3 after second isolation layers and capacitor contact holes are formed.

Referring to FIG. 4, a part of the second isolation film 15a is removed, and the second isolation film 15a covering the sidewalls of the sacrificial layer 14 are reserved as the second isolation layers 15. At this time, two opposite second isolation layers 15 and the substrate 11 form capacitor contact windows. The capacitor contact windows are filled to form capacitor contact holes 16. The physical positions of the capacitor contact holes 16 are the same as the spaces occupied by the capacitor contact windows.

Figure 5:
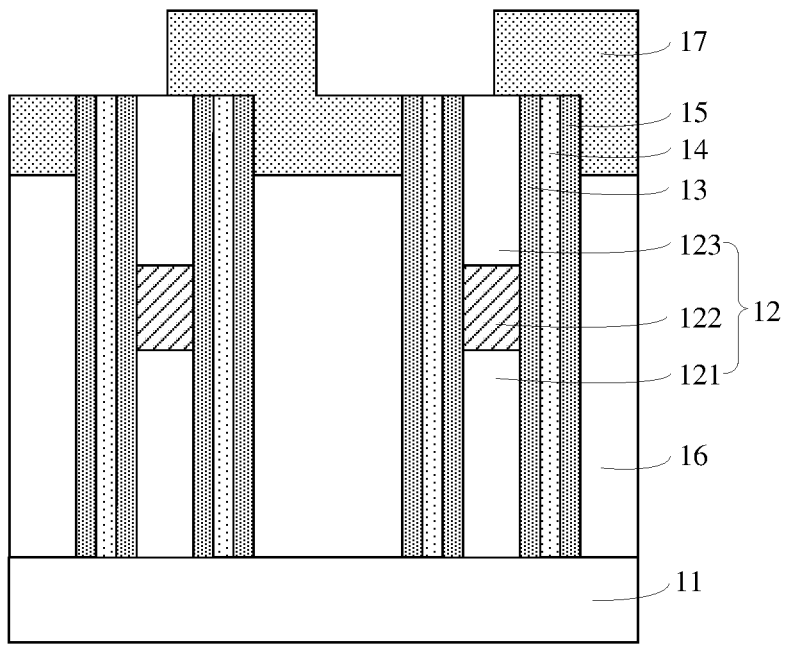
FIG. 5 is a schematic structure diagram of the structure shown in FIG. 4 after landing pads are formed.
Figure 6:
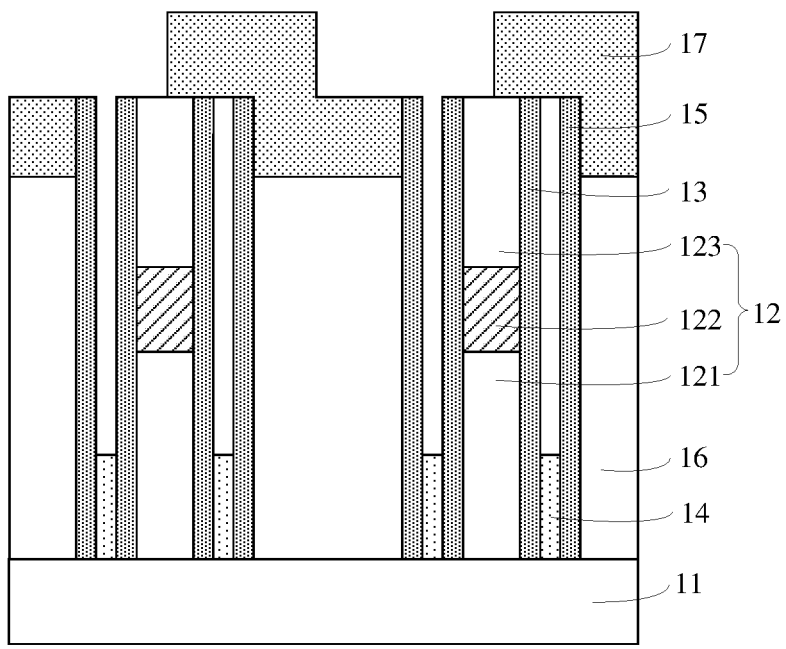
FIG. 6 is a schematic structure diagram of the structure shown in FIG. 5 after parts of the sacrificial layer are formed.

Referring to FIGS. 5 and 6, landing pads 17 are formed. The landing pads 17 come into contact with the top surfaces of the capacitor contact holes 16, and the exposed top surfaces of the sacrificial layer 14 are etched.

Since semiconductor devices are gradually downsized, the sacrificial layer 14 generally has a small width and a large depth-to-width ratio. Therefore, when the sacrificial layer 14 is etched by a dry etching process, it is likely to cause great damage to surrounding devices due to position errors; and, when the sacrificial layer is etched by a wet etching process, the etching agent cannot effectively wet the sacrificial layer 14 at deeper positions due to the large depth-to-width ratio, so that parts of the sacrificial layer 14 are reserved. Since the sacrificial layer 14 has a higher dielectric constant than the air, it is disadvantageous to suppress the signal crosstalk between the bit line structures 12 and the capacitor contact holes 16.

An embodiment of the present disclosure provides a method for forming a semiconductor structure. By controlling second isolation layers to expose the tops and bottoms of sacrificial layer, parts of the sacrificial layer on the bottom are removed firstly before the formation of complete gaps between the layers. Thus, the thickness and depth of the sacrificial layer in the perpendicular direction are reduced, and it is ensured that the subsequent etching agent can effectively wet, etch and remove the remaining of the sacrificial layer to form complete gaps between the layers.

FIGS. 7 to 18 are schematic structure diagrams corresponding to the steps in the method for forming a semiconductor structure according to an embodiment of the present disclosure.

Figure 7:
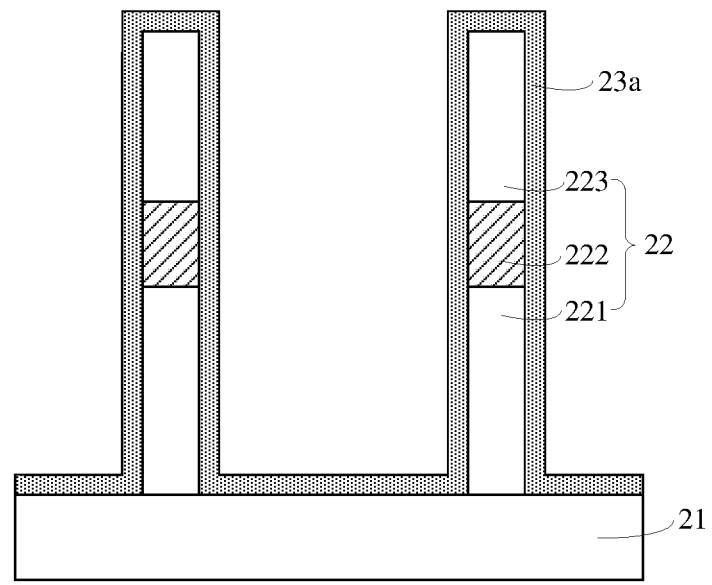
FIG. 7 is a schematic structure diagram of a substrate and bit line structures according to an embodiment of the present disclosure.

Referring to FIG. 7, a substrate 21 and bit line structures 22 are provided, and a first isolation film 23a is formed.

In this embodiment, the substrate 21 comprises active regions and drain regions, and the bit line structures 22 expose source/drain regions, so that the subsequently formed capacitor contact holes come into contact with the source/drain regions to execute electrical operations. Each of the bit line structures 22 comprises a bottom dielectric layer 221, an intermediate conductive layer 222 and a top dielectric layer 223. The material for the bottom dielectric layer 221 and the top dielectric layer 223 is generally silicon nitride, and the material for the intermediate conductive layer 222 is generally tungsten.

In this embodiment, the first isolation film 23a covers the top surfaces and sidewalls of the bit line structures 22, and also covers the surface of the substrate 21. The first isolation film 23a has the equal thickness at different positions. The material for the first isolation film 23a has a high hardness to support the bit line structures 22, and the material for the first isolation film 23a comprises silicon nitride.

The first isolation film 23a can be formed by atomic layer deposition, so that the first isolation film 23a has a high compactness, and the subsequently formed first isolation layers have better supporting and protection effects. In addition, the thickness of the first isolation film 23a can be set to be 1 nm to 5 nm, for example, 2 nm, 3 nm or 4 nm. Thus, the first isolation layers can have good supporting and protection effects, the cross-section area of the capacitor contact windows can be expanded, the contact resistance between the capacitor contact holes and the source/drain regions can be reduced, and the signal transmission performance can be improved.

Figure 8:
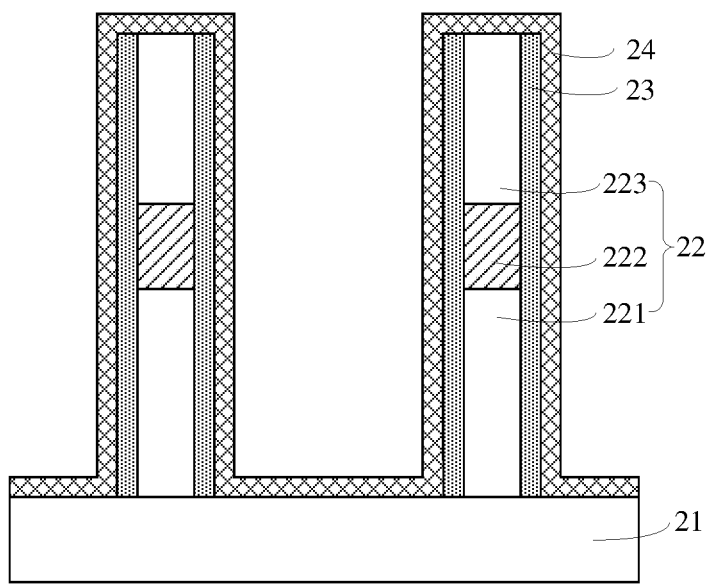
FIG. 8 is a schematic structure diagram of the structure shown in FIG. 7 after first isolation layers and sacrificial layer are formed.

Referring to FIG. 8, first isolation layers 23 and sacrificial layer 24 are formed.

In this embodiment, after the first isolation film 23a (referring to FIG. 7) is formed, the first isolation film 23a is etched from the top down by a dry etching process without a mask, so that the first isolation film 23a covering the top surfaces of bit line structures 22 and the first isolation film 23a covering the surface of the substrate 21 are removed, and the first isolation film 23a covering the sidewalls of the bit line structures 22 is reserved as the first isolation layers 23.

In other embodiments, it is also possible that only the first isolation film covering the tops of the bit line structures is removed to reduce the overall thickness of the semiconductor device and the first isolation film covering the surface of the substrate is reserved to protect the substrate, so that the damage to the substrate by the subsequent process is avoided and the effective electrical connection between the source/drain regions and the capacitor contact holes is ensured.

In this embodiment, the sacrificial layer 24 cover the top surfaces of the bit line structures 22, the top surfaces and sidewalls of the first isolation layers 23 and the surface of the substrate 21. The positions of the sacrificial layer 24 covering the sidewalls of the bit line structures 22 are the positions of the gaps between the layers to be formed subsequently. The thickness of the sacrificial layer 24 is equal to the thickness of the gaps between the layers.

In this embodiment, the sacrificial layer 24 can be formed by atomic layer deposition, so that the sacrificial layer 24 has a small thickness and good step coverage. In a case where the distance between adjacent bit line structures 22 and the thickness of the isolation layers remain unchanged, by reducing the thickness of the sacrificial layer 24, it is advantageous to expand the cross-section area of the capacitor contact windows, increase the contact area between the capacitor contact windows and the source/drain regions and reduce the contact resistance. In addition, since the sacrificial layer 24 has good step coverage, it is advantageous to avoid the contact or too close distance between the subsequently formed second isolation layers and the first isolation layers 23, ensure that the subsequently formed gaps between the layers can effective isolate the bit line structures 22 from the capacitor contact holes, and suppress the signal crosstalk.

In a direction perpendicular to the surface of the substrate 21, the sacrificial layer 24 has a thickness of 1 nm to 3 nm, for example, 1.3 nm, 1.5 nm or 1.7 nm. Thus, it can be ensured that the gaps between the layers formed by etching the sacrificial layer 25 has good isolation effects, the capacitor contact windows can be prevented from occupying too much space, and it can be ensured that the capacitor contact holes have larger cross-section area. That is, good signal transmission performance is ensured between the capacitor contact holes and the source/drain regions.

In this embodiment, the material for the sacrificial layer 24 and the material for the first isolation layers 23 have a higher etching selectivity ratio, so that the influence on the first isolation layers 23 from the etching process applied to the sacrificial layer 24 is reduced. In addition, the influence on the bit line structures 22 and the substrate 21 is reduced, and the process cost is lowered. The material for the sacrificial layer 24 may be silicon oxide with low cost, so that the manufacturing cost of the semiconductor structure is reduced. The material for the sacrificial layer 24 may also be an organic material with low removal difficulty, so that the material can be subsequently removed by ashing and it is advantageous to reduce the influence on other films.

Figure 9:
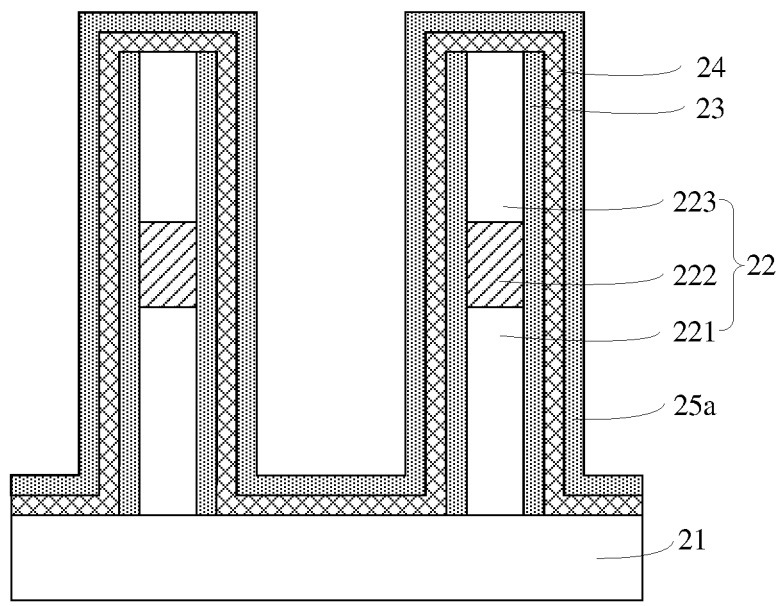
FIG. 9 is a schematic structure diagram of the structure shown in FIG. 8 after second isolation layers are formed.
Figure 10:
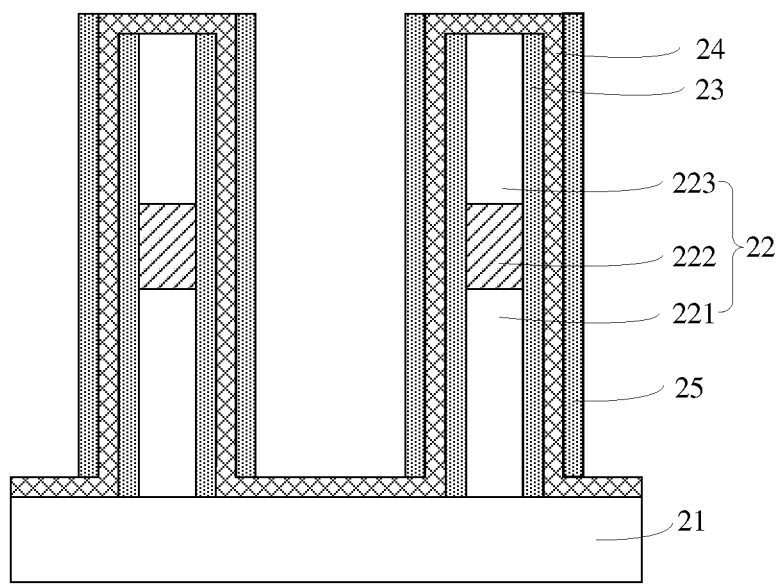
FIG. 10 is a schematic structure diagram of the structure shown in FIG. 9 after second isolation layers are formed.

Referring to FIGS. 9 and 10, second isolation layers 25 are formed.

In this embodiment, the second isolation film 25a covering the sidewalls of the sacrificial layer 24 has a first thickness, the second isolation film 25a covering the other parts of the sacrificial layer 24 has a second thickness, and the first thickness is greater than the second thickness. In other words, the second isolation film 25a covering the sidewalls of the sacrificial layer 24 is thicker. Correspondingly, the second isolation film 25a has a thickness of 5 nm to 30 nm, for example, 10 nm, 15 nm, 20 nm or 25 nm. The material for the second isolation film 25a has a higher hardness to support the subsequently formed capacitor contact holes. For example, the material is silicon nitride.

In this embodiment, the second isolation film 25a can be formed by atomic layer deposition. Then, the second isolation film 25a is etched from the top down by a dry etching process without a mask to expose the top surfaces of the sacrificial layer 24 and parts of the sacrificial layer 24 covering the surface of the substrate 21. The remaining of the second isolation film 25a is used as the second isolation layers 25. The second isolation layers 25 expose the bottoms of the sacrificial layer 24.

Figure 11:
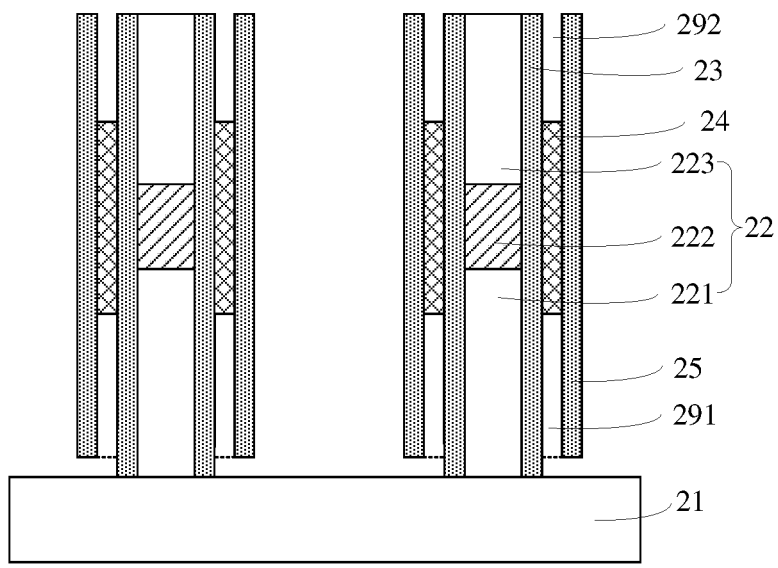
FIG. 11 is a schematic structure diagram of the structure shown in FIG. 10 after bottom gaps are formed.

Referring to FIG. 11, bottom gaps 291 are formed.

In this embodiment, after parts of the sacrificial layer 24 covering the surface of the substrate 21 are exposed, the second isolation layers 25, the exposed bottoms of the sacrificial layer 24 and the exposed top surfaces of the sacrificial layer 24 are etched with a chemical gas by a chemical etching process without a mask, to form bottom gaps 291 and top gaps 292 between the first isolation layers 23 and the second isolation layers 25. Since the chemical gas has a high etching selectivity ratio for the material for the sacrificial layer 24, in the process of forming the bottom gaps 291 and the top gaps 292, the bottom gaps 291 and top gaps 292 having a larger depth-to-width ratio can be formed at the expense of only the second isolation layers 25 with a smaller thickness.

In the process of forming the bottom gaps 291 and the top gaps 292, the chemical gas also etches the second isolation layers 25 with a partial thickness, and the remaining of the second isolation layers 25 with a partial thickness are used as final second support layers 25 for supporting the capacitor contact holes. The thickness of the second isolation layers 25 removed as the sacrificial layer is determined by the height in the perpendicular direction and the etching selectivity ratio. In a direction perpendicular to the surface of the substrate 21, if the height of the bottom gaps 291 is larger, the thickness of the removed second isolation layers 25 is larger, and the thickness of the remaining of the second isolation layers 25 is smaller; and, if the etching selectivity ratio is higher, the thickness of the removed second isolation layers 25 is smaller, and the thickness of the remaining of the second isolation layers 25 is larger. The height reference is the surface of the substrate 21.

Since the sacrificial layer 24 has a smaller thickness, the mask alignment accuracy is highly required. Compared with the dry etching process, by removing parts of the sacrificial layer 24 by a chemical etching process, it is advantageous to avoid ion bombardment damage caused by large alignment errors during the dry etching process. The ion bombardment damage includes the rouge surface caused by ion bombardment and the change of inherent properties caused by ion injection. The ion bombardment damage generally occurs on the tops of the first isolation layers 23, the tops of the second isolation layers 25 and the tops of the top dielectric layers 223.

In this embodiment, the height of the bottom gaps 291 to be formed is determined by the height of the bit line structures 22 located on the substrate 21, or the height of the first isolation layers 23 covering the sidewalls of the bit line structures 22. If the height of the first isolation layers 23 is larger, the height of the bottom gaps 291 is larger, the depth of the remaining of the sacrificial layer 24 is smaller, and it is easier to subsequently remove the remaining of the sacrificial layer 24 by etching the exposed top surfaces of the sacrificial layer 24, so as to form complete gaps between the layers.

The ratio of the thickness of the bottom gaps 291 to the thickness of the first isolation layers 23 is 5 to 10, for example, 6, 7 or 9. If the ratio is too small, it is disadvantageous to subsequently remove the remaining of the sacrificial layer 24 through the top surfaces of the sacrificial layer 24; however, if the ratio is too large, the etching time will be too long, and thicker second isolation layers 25 are required to serve as the sacrificial material. That is, a longer time is required to form the second isolation film 25a (referring to FIG. 9), and more of the top dielectric layer 223 will be etched, and the isolation effect of the top dielectric layer 223 on the intermediate conductive layer 222 is reduced. In order to meet the criteria for the vertical thickness of the existing bit line structures 22, the thickness of the bottom gaps 291 is generally set to be 30 nm to 200 nm, for example, 60 nm, 110 nm or 160 nm.

It is to be noted that, after the bottom gaps 291 are formed, the bottoms of the second isolation layers 25 are not supported. At this time, the second isolation layers are fixed by a bonding force with the sacrificial layer 24. The bonding force comprises a viscous force and an intermolecular force.

Figure 12:
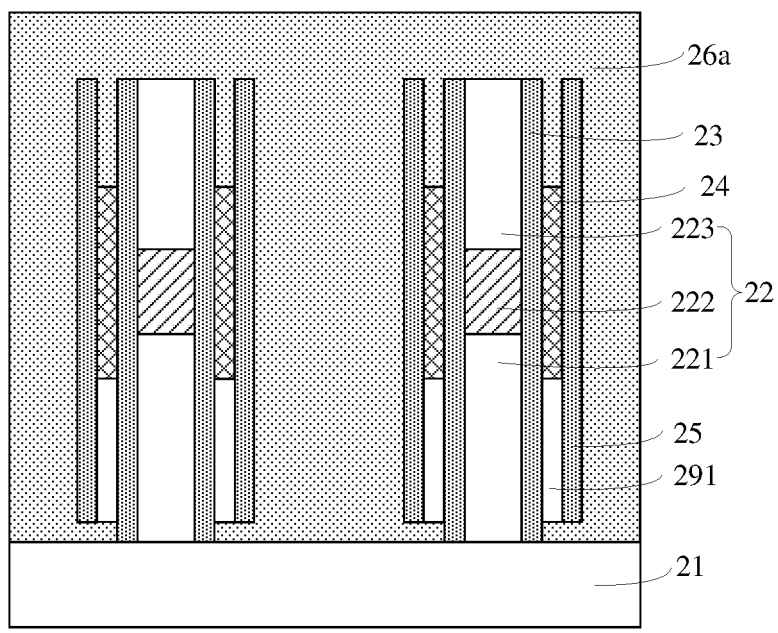
FIG. 12 is a schematic structure diagram of the structure shown in FIG. 11 after a third isolation film is formed.
Figure 13:
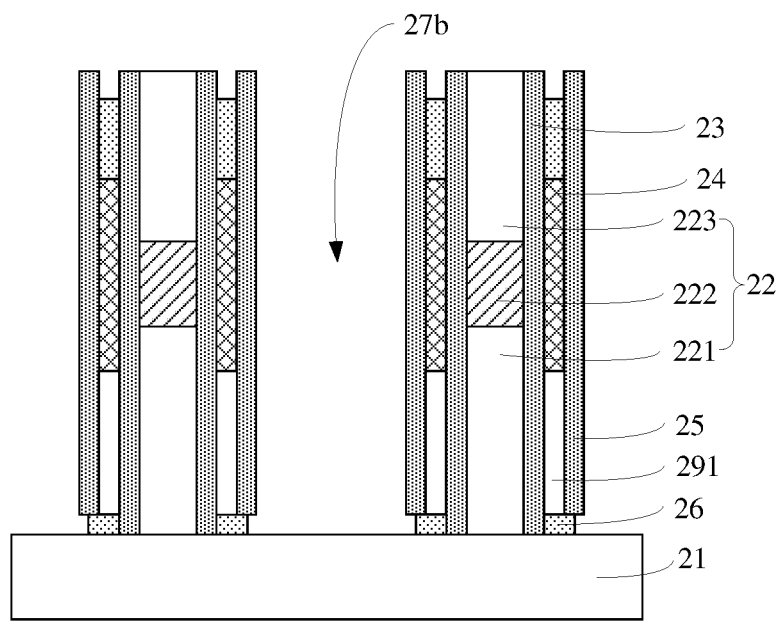
FIG. 13 is a schematic structure diagram of the structure shown in FIG. 12 after third isolation layers and capacitor contact windows are formed.

Referring to FIGS. 12 and 13, third isolation layers 26 are formed.

In this embodiment, after the bottom gaps 291 and the top gaps 292 are formed, a third isolation film 26a is formed. The third isolation film 26a fills the gaps between two opposite second isolation layers 25, the gaps between the bottom gaps 291 and the substrate 21, the gaps between the second isolation layers 25 and the substrate 21, and the top gaps 292 (referring to FIG. 11). The third isolation film 26a can be formed by spin coating, and the material for the third isolation film 26a can be the same as or different from the material for the sacrificial layer 24.

In this embodiment, after the third isolation film 26a is formed, a part of the third isolation film 26a is removed by a wet etching process, and the third isolation film 26a located between the bottom gaps 291 and the substrate 21, located in the top gap 292 and located between the second isolation layers 25 and the substrate 21 is reserved as the third isolation layers 26. The third isolation layers 26 together with the second isolation layers 25 and the substrate 21 form capacitor contact windows 27b. The third isolation layers 26 isolate the capacitor contact windows 27b from the bottom gaps 291, so that the contact between the subsequently formed capacitor contact holes and the first isolation layers 23 is avoided, the distance between the capacitor contact holes and the bit line structures 22 is increased, and the signal crosstalk is suppressed.

Since the thickness of the third isolation film 26a located between the second isolation layers 25 and the substrate 21 is equal to the thickness of the sacrificial layer 24 but the sacrificial layer 24 has a smaller thickness, during the wet etching process, the etching agent cannot effectively wet this part of the third isolation film 2, so that the wet etching process can remove only the part of the third isolation film 26a located between the second isolation layers 25 and the substrate 21, and parts of the sacrificial layer 24 are reserved as the third isolation layers 26 for isolating the bottom gaps 291 from the capacitor contact windows 27b. Meanwhile, since the part of the third isolation film 26a located between the second isolation layers 25 and the substrate 21 is removed, the capacitor contact windows formed by the third isolation layers 26 and the second isolation layers 25 further comprise the etched gaps located between the second isolation layers 25 and the substrate 21, and the bottom surface area of the capacitor contact windows 27b is greater than the top surface area thereof.

In addition, during the wet etching process, the third isolation film 26a located in the top gaps 292 is also partially etched, and the finally formed third isolation layers 26 fill only the partial spaces of the top gaps 292. The etching agent used in the wet etching process may be buffered oxide etch (BOE). The BOE comprises 10% to 40 by weight of ammonium fluoride ($NH_4F$) as a buffer, 2% to 10% by weight of hydrofluoric acid (HF) as an etching agent, and water as a thinner.

Figure 14:
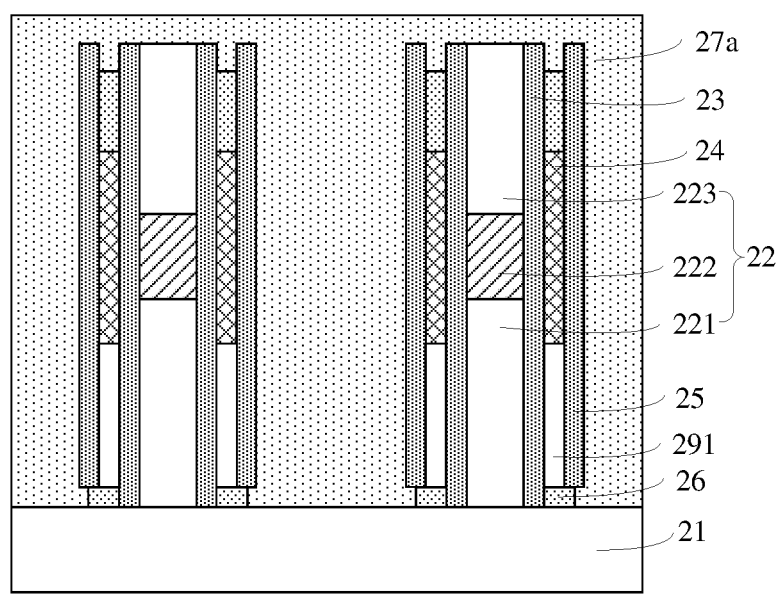
FIG. 14 is a schematic structure diagram of the structure shown in FIG. 13 after a conductive film is deposited.
Figure 15:
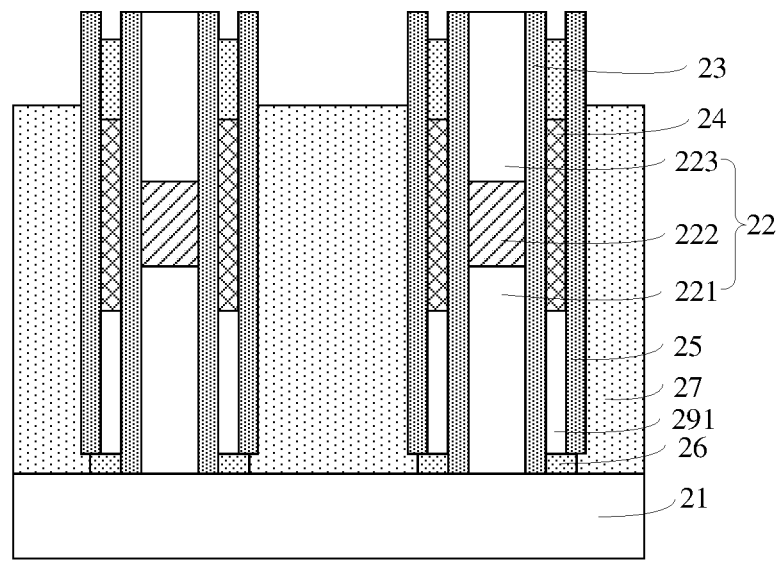
FIG. 15 is a schematic structure diagram of the structure shown in FIG. 14 after capacitor contact holes are formed.

Referring to FIGS. 14 and 15, capacitor contact holes 27 are formed.

In this embodiment, after the third isolation layers 26 are formed, a conductive film 27a is deposited and etched back to form capacitor contact holes 27 filling the capacitor contact windows 27b (referring to FIG. 13). The material for the capacitor contact holes 27 comprises polycrystalline silicon. The polycrystalline silicon can be produced by reacting precursors such as dichlorosilane (DCS), monosilane ($SiH_4$) and disilane ($Si_2H_6$). In addition to the signal transmission effect, the capacitor contact holes 27 also have a role of supporting and fixing the second isolation layers 25, thereby avoiding the loss of support to the second isolation layers 25 caused by the subsequent removal of the sacrificial layer 24.

Since the bottom surface area of the capacitor contact windows 27b is greater than the top surface area thereof, the bottom surface area of the capacitor contact holes 27 filling the capacitor contact windows 27b is greater than the top surface area thereof, there are a larger contact area and a smaller contact resistance between the capacitor contact holes 27 and the source/drain regions in the substrate 21, and it is advantageous to provide signal transmission performance between the capacitor contact holes 27 and the source/drain regions.

Figure 16:
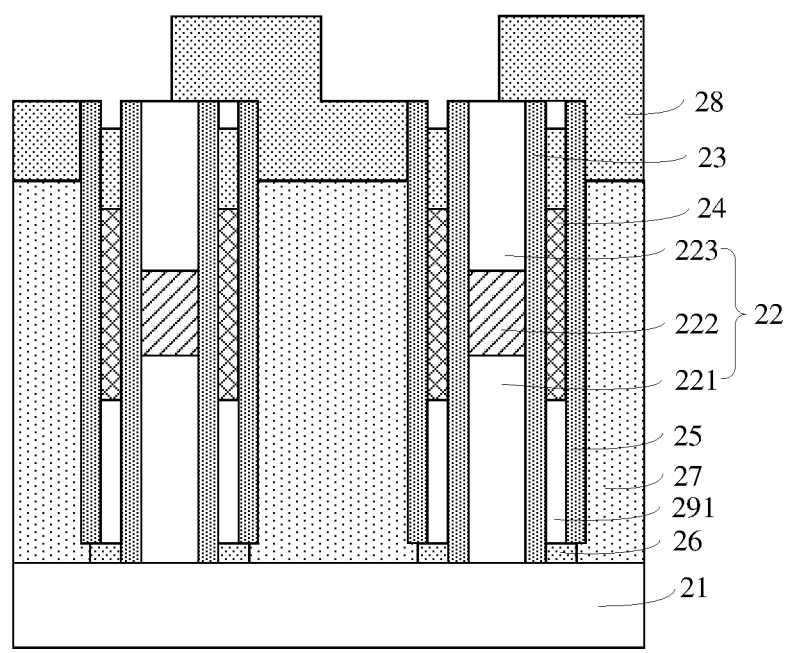
FIG. 16 is a schematic structure diagram of the structure shown in FIG. 15 after landing pads are formed.
Figure 17:
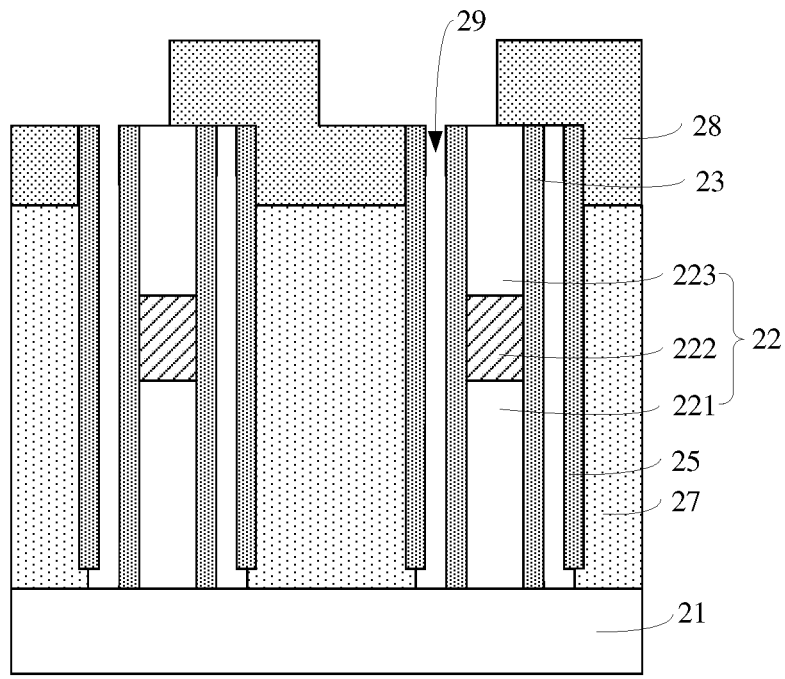
FIG. 17 is a schematic structure diagram of the structure shown in FIG. 16 after gaps between the layers are formed.
Figure 18:
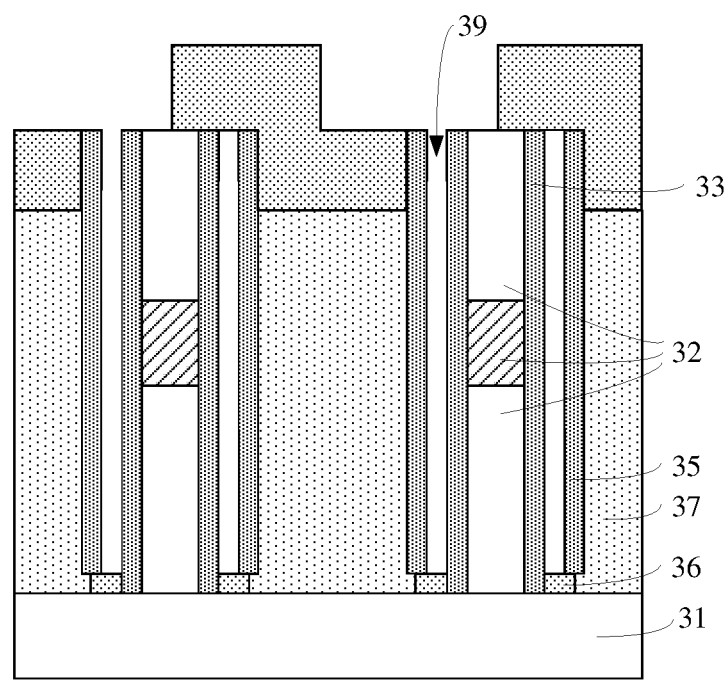
FIG. 18 is a schematic structure diagram of a semiconductor structure according to an embodiment of the present disclosure.

Referring to FIGS. 16 and 17, landing pads 28 and gaps between the layers 29 are formed.

In this embodiment, after the capacitor contact holes 27 are formed, landing pads 28 are formed. The landing pads 28 are connected to the top surfaces of the capacitor contact holes 27. The arrangement array of the landing pads 28 is different from the arrangement array of the capacitor contact holes 27. By forming the landing pads 28 before the formation of the gaps between the layers 29, it is advantageous to prevent the material for the landing pads 28 from falling into deeper positions of the gaps between the layers, and it is ensured that the subsequently formed gaps between the layers 29 have good isolation effects.

It is to be noted that, since the top gaps 292 (referring to FIG. 110 are located above the intermediate conductive layers 222 in a direction perpendicular to the substrate 21, the top dielectric layers 223 are provided between the top gaps 292 and the intermediate conductive layers 222 and the top dielectric layers 223 have signal isolation effects, even if the landing pads 28 are also located in the top gaps 292 and the part of the redundant material is not removed subsequently, the isolation effects of the gaps between the layers 29 will not be affected. That is, the gaps between the layers 29 can effectively suppress the signal crosstalk between the bit line structures 22 and the capacitor contact holes 27.

After the landing pads 28 are formed, the chemical etching process is performed again. The third isolation layers 26 located in the top gaps 292 and the remaining of the sacrificial layer 24 have a smaller depth and therefore can be effectively removed by the chemical gas to form gaps between the layers 29. The gaps between the layers 29 comprise the bottom gaps 291 and the top gaps 292.

In this embodiment, by the chemical etching process, the third isolation layers covering the surface of the substrate 21 are also etched, in order to expand the range of the gaps between the layers 29, reduce the dielectric constant of the spaces (including gaps) between the bit line structures 22 and the capacitor contact holes 27, suppress the signal crosstalk between the capacitor contact holes 27 and the bit line structures 22 and suppress bit line coupling. In other embodiments, referring to FIG. 28, the third isolation layers 36 covering the surface of the substrate 31 are reserved.

In this embodiment, in the process of forming the gaps between the layers, the exposed bottoms of the sacrificial layer are etched firstly to decrease the thickness and depth of the sacrificial layer, and then the exposed top surfaces of the sacrificial layer are etched. Since the thickness and depth have been decreased correspondingly, the remaining of all sacrificial layer can be removed more easily by the subsequent etching of the tops, so that relatively complete gaps between the layers are formed. Thus, it is ensured that the gaps between the layers have a lower dielectric constant, and the signal crosstalk between the bit lines and the capacitor contact holes is effectively suppressed.

An embodiment of the present disclosure further provides a semiconductor structure, which can be formed by the method for manufacturing a semiconductor structure described above.

Referring to FIG. 8, the semiconductor structure comprises: a substrate 31 and a plurality of discrete bit line structures 32, the bit line structures 32 being located on the substrate 31; capacitor contact holes 37, located between adjacent bit line structures 32; first isolation layers 33, the first isolation layers 33 covering the sidewalls of the bit line structures 32; second isolation layers 35, the second isolation layers 35 covering the sidewalls of the capacitor contact holes 37, the second isolation layers 35 being not in contact with the substrate 31; and, gaps between the layers 39, located between the first isolation layers 33 and the second isolation layers 35.

The semiconductor structure further comprises: third isolation layers 36, the third isolation layers 36 being located between the second isolation layers 35 and the substrate 31 to isolate the gaps between the layers 39 from the capacitor contact holes 37, wherein the dielectric constant of the material for the third isolation layers 36 is less than that of the material for the second isolation layers 35, in order to improve the isolation effects of the third isolation layers 36 and suppress the signal crosstalk.

In this embodiment, the capacitor contact holes 37 are also located between the second isolation layers 35 and the substrate 31, and the bottom surface area of the capacitor contact holes 37 is greater than the top surface area thereof.

The embodiment of the present disclosure provides a semiconductor structure, having complete gaps between the layers 39 between the bit line structures 32 and the capacitor contact holes 37, so that the signal crosstalk between the bit line structures 32 and the capacitor contact holes 37 can be effectively suppressed.

Various embodiments or implementations in this specification have been described progressively, and each embodiment focuses on the differences from other embodiments, so the same and similar parts of the embodiments may refer to each other.

In the description of this specification, the description with reference to terms "an embodiment", "an exemplary embodiment", "some embodiments", "an illustrative implementation" or "an example" means that specific features, structures, materials or characteristics described with reference to an implementation or example are included in at least one implementation or example of the present disclosure.

In this specification, the schematic expressions of the terms do not necessarily refer to the same implementation or example. In addition, the described specific features, structures, materials or characteristics may be combined in any one or more implementations or examples in a proper way.

In the description of the present disclosure, it should be understood that the orientation or position relationship indicated by terms "center", "upper", "lower", "left", "right", "vertical", "horizontal", "inner", "outer" and the like is an orientation or position relationship illustrated on the basis of the drawings, and is only for describing the present disclosure and simplifying the description, rather than indicating or implying that the specified device or element must have a particular direction and be constructed and operated in a particular direction. Therefore, the terms cannot be interpreted as limitations to the present disclosure.

It should be understood that the terms such as "first" and "second" used in the present disclosure can be used in the present disclosure to describe various structures, but these structures are not limited by these terms. The terms are only used to distinguish a first structure from another structure.

Throughout one or more drawings, the same elements are denoted by similar reference numerals. For clarity, many parts in the drawings are not drawn to scale. In addition, some known parts may not be shown. For simplicity, the structures obtained after several steps can be described in one drawing. Many specific details of the present disclosure are described hereinafter, for example, the structures, materials, sizes, processing processes and technologies of the devices, in order to understand the present disclosure more clearly. As will be understood by those skilled in the art, the present disclosure may be implemented without these specific details.

Finally, it is to be noted that the foregoing embodiments are only used for describing the technical solutions of the present disclosure, rather than limiting the present disclosure. Although the present disclosure has been described in detail by the foregoing embodiments, a person of ordinary skill in the art should understood that modifications can still be made to the technical solutions recorded in the foregoing embodiments or equipment replacements can be made to some or all of the technical features, and these modifications or replacements do not make the essence of the corresponding technical solutions depart from the scope of the technical solutions in the embodiments of the present disclosure.

INDUSTRIAL APPLICABILITY

In the semiconductor structure and the forming method thereof according to the embodiments of the present disclosure, in the process of forming gaps between the layers, the exposed bottoms of the sacrificial layer are etched firstly to reduce the thickness and depth of the sacrificial layers, and the exposed top surfaces of the sacrificial layer are then etched. Since the thickness and depth in the perpendicular direction have been reduced correspondingly, the remaining of all sacrificial layer can be effectively removed by the subsequent etching of the tops, so that relatively complete gaps between the layers are formed. Thus, it is ensured that the spaces between the bit line structures and the capacitor contact holes have a lower dielectric constant, and the signal crosstalk between the bit line structures and the capacitor contact holes is suppressed. In addition, compared with the removal of the second isolation film by a dry etching process, by performing etching by a chemical etching process without a mask, it is advantageous to the ion bombardment damage to the tops of the bit line structures, the tops of the first isolation layers and the tops of the second isolation layers, and it is ensured that the bit line structures, the first isolation layers and the second isolation layers have good structure performances.

The invention claimed is:

1. A method for forming a semiconductor structure, comprising:
   providing a substrate and a plurality of discrete bit line structures, the bit line structures being located on the substrate, capacitor contact windows being provided between adjacent bit line structures;
   forming first isolation layers, the first isolation layers covering sidewalls of the bit line structures;
   forming a sacrificial layer, the sacrificial layer covering sidewalls of the first isolation layers;
   forming second isolation layers, the second isolation layers covering sidewalls of the sacrificial layer and exposing top surfaces and bottoms of the sacrificial layer;
   etching the top surfaces and the bottoms of the sacrificial layer to form top gaps, bottom gaps and a remaining part of the sacrificial layer between the first isolation layers and the second isolation layers; and
   etching from the top surfaces of the sacrificial layer to remove the remaining part of the sacrificial layer so as to form gaps directly between the first isolation layers and the second isolation layers.

2. The method for forming the semiconductor structure according to claim 1, wherein, in a direction perpendicular to a surface of the substrate, a ratio of a thickness of the bottom gaps to a thickness of the first isolation layers is 5 to 10.

3. The method for forming the semiconductor structure according to claim 1, the sacrificial layer further covers a surface of the substrate, and a process step of forming the second isolation layers comprises:
   forming a second isolation film, the second isolation film covering a surface of the sacrificial layer; and
   removing part of the second isolation film to expose the top surfaces of the sacrificial layer and expose parts of the sacrificial layer covering the surface of the substrate, remaining of the second isolation film being the second isolation layers.

4. The method for forming the semiconductor structure according to claim 3, wherein the second isolation film covering the sidewalls of the sacrificial layer has a first thickness, the second isolation film covering the top surfaces and the bottoms of the sacrificial layer has a second thickness, and the first thickness is greater than the second thickness; and, a process step of forming the top gaps and the bottom gaps comprises:
   performing a chemical etching process to etch the second isolation layers, the top surfaces and the bottoms of the sacrificial layer by a chemical gas without a mask, and reserving the second isolation layers with a partial thickness.

5. The method for forming the semiconductor structure according to claim 3, after forming the bottom gaps, the method further comprises: forming third isolation layers, the third isolation layers being located between the second isolation layers and the substrate to isolate the bottom gaps from the capacitor contact windows.

6. The method for forming the semiconductor structure according to claim 1, after forming the bottom gaps, the method further comprises: forming third isolation layers, the third isolation layers being located between the second isolation layers and the substrate to isolate the bottom gaps from the capacitor contact windows.

7. The method for forming the semiconductor structure according to claim 6, wherein a process step of forming the third isolation layers comprises:
   forming a third isolation film, the third isolation film filling gaps between adjacent second isolation layers and being filled between the second isolation layers and the substrate; and
   removing the third isolation film between adjacent second isolation layers, and reserving the third isolation film between the second isolation layers and the substrate to serve as the third isolation layers.

8. The method for forming the semiconductor structure according to claim 7, wherein the third isolation layers further fill the top gaps.

9. The method for forming the semiconductor structure according to claim 7, wherein, in a direction parallel to a surface of the substrate, the sacrificial layer has a thickness of 1 nm to 3 nm; and, the third isolation film is etched and removed by a wet etching process.

10. The method for forming the semiconductor structure according to claim 7, wherein the capacitor contact windows comprise gaps between adjacent second isolation layers and gaps between adjacent ones of the second isolation layers and the substrate, and a bottom surface area of the capacitor contact window is greater than a top surface area of the capacitor contact window.

11. The method for forming the semiconductor structure according to claim 10, after forming the bottom gaps and before forming the gaps between the first isolation layers and the second isolation layers, the method further comprises:
   forming capacitor contact holes, the capacitor contact holes filling the capacitor contact windows, the capacitor contact holes being in contact with sidewalls of the second isolation layers and the substrate.

12. The method for forming the semiconductor structure according to claim 1, after forming the bottom gaps and before forming the gaps between the first isolation layers and the second isolation layers, the method further comprises:
   forming capacitor contact holes, the capacitor contact holes filling the capacitor contact windows, the capacitor contact holes being in contact with sidewalls of the second isolation layers and the substrate.

13. The method for forming the semiconductor structure according to claim 12, wherein the capacitor contact holes are further located between the second isolation layers and the substrate, and a bottom surface area of the capacitor contact hole is greater than a top surface area of the capacitor contact hole.

* * * * *